United States Patent [19]
Hodson et al.

[11] Patent Number: 5,389,578
[45] Date of Patent: Feb. 14, 1995

[54] OPTICAL COUPLER

[75] Inventors: Lester L. Hodson, McKinney; Kirk S. Laney, Plano, both of Tex.

[73] Assignee: Texas Instruments Incorporated, Dallas, Tex.

[21] Appl. No.: 178,174

[22] Filed: Jan. 4, 1994

[51] Int. Cl.$^6$ .......................................... H01L 21/60
[52] U.S. Cl. .................................. 437/209; 437/205; 437/214; 437/217; 437/218
[58] Field of Search .............. 437/209, 205, 220, 2, 437/3, 7, 23, 906, 916, 927, 211, 214, 218, 219, 217

[56] References Cited

U.S. PATENT DOCUMENTS

| | | | |
|---|---|---|---|
| 4,047,045 | 9/1977 | Paxton, Jr. et al. | 250/551 |
| 4,203,792 | 5/1980 | Thompson | 437/211 |
| 4,322,628 | 3/1982 | Tanaka | 250/551 |
| 4,446,375 | 5/1984 | Aird | 250/551 |
| 4,604,495 | 8/1986 | Watanabe | 437/218 |
| 4,633,582 | 1/1987 | Ching et al. | 29/827 |
| 4,755,474 | 7/1988 | Moyer | 437/906 |
| 4,822,536 | 4/1989 | Voinis et al. | 437/211 |
| 4,863,806 | 9/1989 | Merrick et al. | 428/571 |
| 4,877,756 | 10/1989 | Yamamoto et al. | 437/220 |
| 4,996,577 | 2/1991 | Kinzer | 437/23 |
| 5,049,527 | 9/1991 | Merrick et al. | 437/220 |
| 5,057,457 | 10/1991 | Miyahara et al. | 437/211 |
| 5,148,243 | 9/1992 | Merrick et al. | 357/17 |
| 5,233,208 | 8/1993 | Thillays | 257/82 |

*Primary Examiner*—Brian E. Hearn
*Assistant Examiner*—Kevin M. Picardat
*Attorney, Agent, or Firm*—Warren L. Franz; Wade James Brady, III; Richard L. Donaldson

[57] ABSTRACT

An optical coupler (10) and method of manufacturing the optical coupler (10) are disclosed. The optical coupler (10) includes a light emitter (12), a light detector (18, 22), an inner mold material (30), and a precision reflector (32) for efficiently reflecting light from the emitter (12) to the light detector (18, 22). In manufacturing the coupler (10), the light emitter (12) is coupled to a first mount lead (14) and the light detector (18) is coupled to a second mount lead (20). There may be more than one light emitter (12) or light detector (18,22). A transparent inner mold material (30) surrounds and encases the light emitter (12) and light detector (18) along with a portion of the first and second mount leads (14, 20) and forms a precision molded reflector (32) over the light emitter (12) and light detector (18). The precision molded reflector (32) may be a precision molded dome (38) or a precision molded multi-faceted vault (44). The precision molded reflector (32) has a reflective coating (34) for returning light from the light emitter (12) to the light detector (18, 22). The light emitter (12), light detector (18, 22), a portion of the mount leads (14, 20), and the inner mold material (30) are encased by an opaque overmold (36).

18 Claims, 2 Drawing Sheets

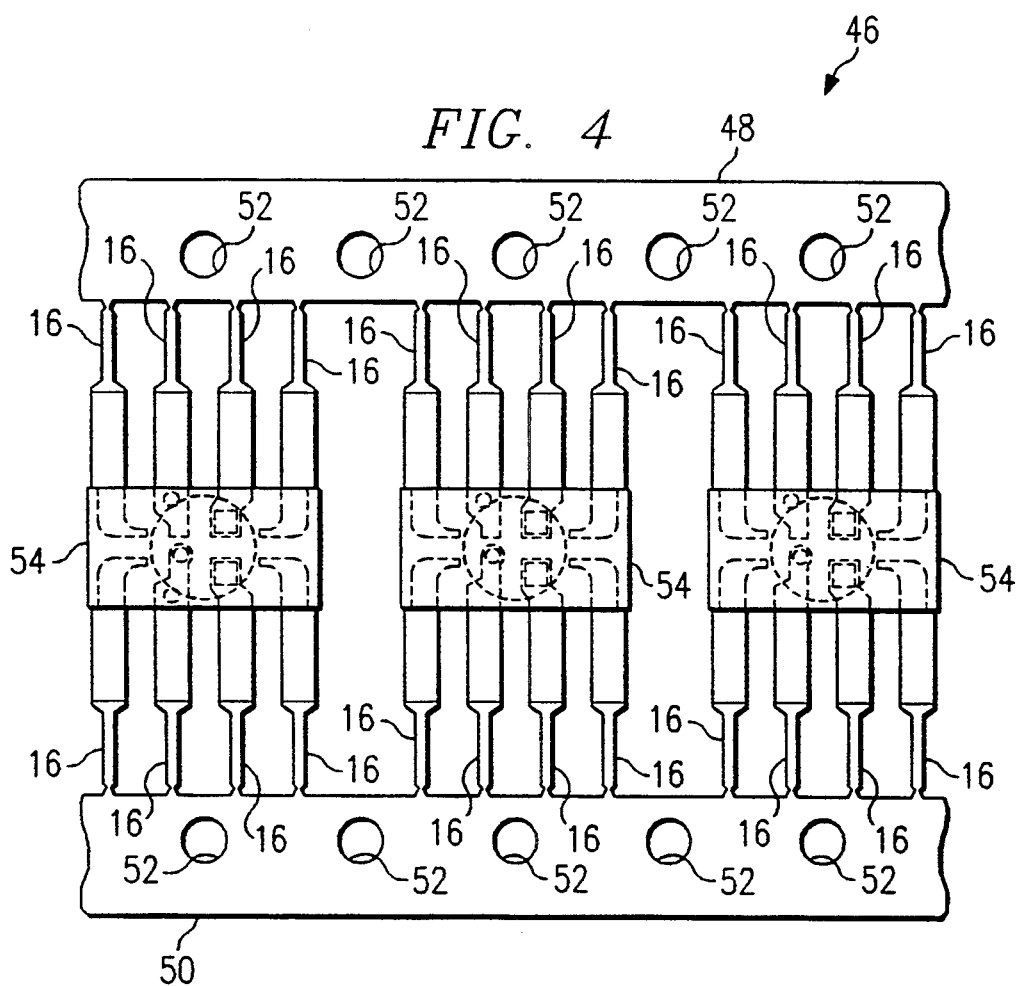

1

OPTICAL COUPLER

TECHNICAL FIELD OF THE INVENTION

This invention relates to optronics, and more particularly, relates to optical couplers.

BACKGROUND OF THE INVENTION

Optical couplers are frequently used to transfer signals from one circuit to another circuit where it is desirable to electrically isolate the circuits. For example, optical couplers may be used to transmit signals between circuits with widely disparate voltage levels while maintaining the desired electrical isolation between the circuits.

Optical couplers typically include a light emitter (source) and light detector (receiver) without electrical connections between the emitter and detector. The light emitted may be at infrared or visible wavelengths. The receiver is usually selected to substantially match the operating wavelengths of the emitter. After the light emitter receives an input signal from its associated circuit, the emitter will produce a light signal corresponding to the input signal. The light signal is received in some form by the detector and converted into an output signal which is supplied to the circuit associated with the detector. Thus, the input and output signals may be considered coupled between the respective circuits associated with the emitter and the detector.

SUMMARY OF THE INVENTION

In accordance with the present invention, the disadvantages and problems associated with previous optical couplers and methods of manufacturing optical couplers have been substantially reduced or eliminated. The present invention provides an optical coupler and method of manufacturing an optical coupler that allow for an efficient reflection of light from an emitter to a detector and provides a coupler that is readily molded, allows for electrical isolation at high voltages, and is relatively inexpensive to manufacture.

In accordance with one aspect of the present invention, an optical coupler is provided that includes a light emitter coupled to a first conductive mount lead, a light detector coupled to a second conductive mount lead, an inner mold material surrounding and encasing the light emitter and light detector, a precision reflector formed as part of the inner mold material proximate to the light emitter and light detector for reflecting emitted light from the light emitter to the light detector, and an overmold encasing the inner mold material and a portion of the first and second leads.

In accordance with another aspect of the present invention, a method of manufacturing an optical coupler is provided that entails providing a first and second conductive mount lead, coupling a light emitter to the first lead, coupling a light detector to the second lead while maintaining the light detector electrically isolated from the light emitter, surrounding and encasing the light emitter and light detector with an inner mold which is substantially transparent to the wavelengths of light emitted by the light emitter, forming a precision reflector as part of the inner mold proximate to the light emitter and light detector, and encasing the inner mold material and a portion of the first and second leads with an overmold.

A technical advantage of the invention is that an optical coupler according to one aspect of the present invention may be more easily and less expensively manufactured according to another aspect of the present invention. Another technical advantage is that the light is efficiently transmitted from the emitter to the reflector and then to the detector of the optical coupler according to one aspect of the present invention.

BRIEF DESCRIPTION OF THE DRAWINGS

For a more complete understanding of the present invention, and the advantages thereof, reference is now made to the following description taken in conjunction with the accompanying drawings, in which:

FIG. 4 is a schematic plan view of a leadframe for manufacturing optical couplers according to an aspect of the present invention.

DETAILED DESCRIPTION OF THE INVENTION

The preferred embodiment of the present invention and its advantages are best understood by referring to FIGS. 1–4 of the drawings, like numerals being used for like and corresponding parts of the various drawings.

Figure 1:
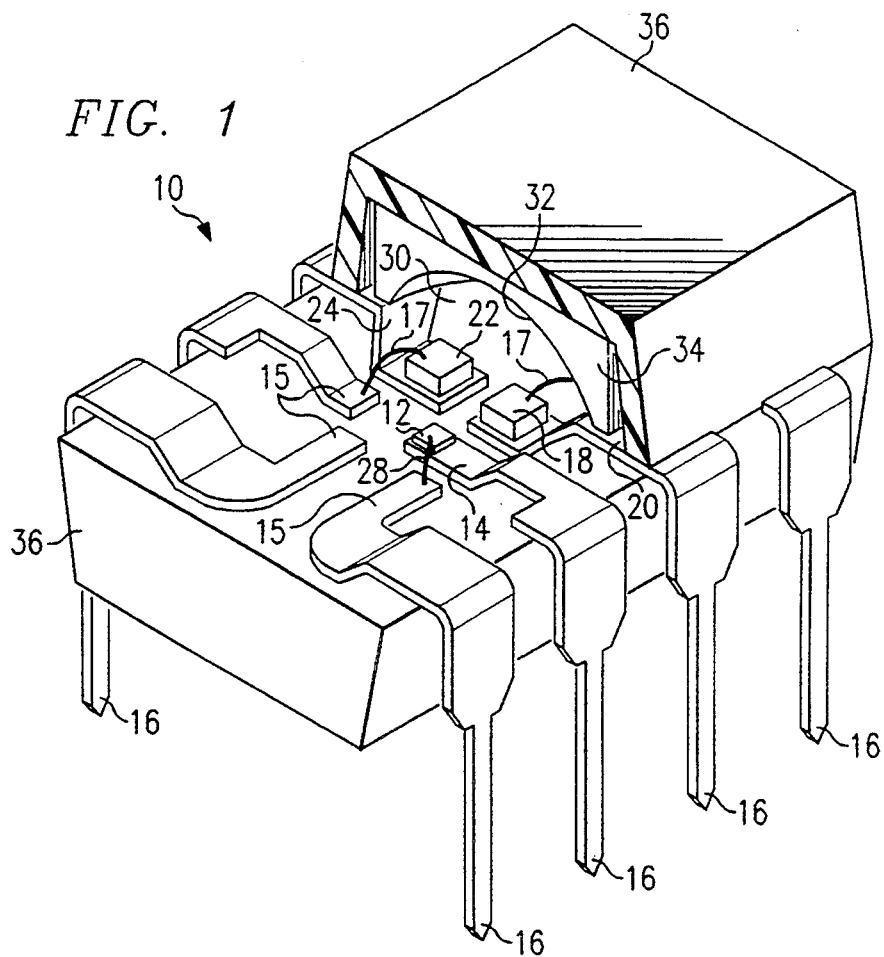
FIG. 1 is an isometric in perspective with portions broken away showing one embodiment of an optical coupler incorporating an aspect of the present invention.

Optical coupler 10 incorporating one embodiment of the present invention is shown in FIG. 1. Optical coupler 10 includes light emitter 12, which is coupled or mounted to first mount lead 14, which is part of a protruding lead 16. Light emitter 12 may be a light emitting diode (LED) or any suitable device which emits photon energy when properly biased by an input signal. For example, a gallium arsenide LED may be used as light emitter 12. Only one light emitter 12 is shown, but it is to be understood that additional light emitters 12 could be incorporated when desired, e.g., when building an AC input optical coupler.

Light detector or photosensor 18 is coupled or mounted to second mount lead 20, which is part of a protruding lead 16. As with light emitter 12, additional light detectors may be incorporated in optical coupler 10 when desired; for example, optical coupler 10 of FIG. 1 includes a second light detector 22 that is mounted to mount lead 24. Light detectors 18 and 22 may be any device responsive to the photon energy emitted by light emitter 12; for example, light detectors 18 and 22 may be photodiodes. As additional examples, light detector or photosensor 18 could be a phototransistor or a photodiode in the form of an integral cell on a chip with additional structure to provide a specific output to the optocoupler other than current. If silicon light detectors are used, an infrared light emitter may be desirable.

Each light detector 18 and 22 preferably has lead or connecting means 17 connecting the respective detector electrically to a free end or ends 15 of protruding lead or leads 16, which are typically connected to a circuit. Leads 17 are representative of any number of leads that may be used as necessary for the proper operation of each light detector or photosensor 18 and 22. Likewise, lead or connecting means 28 is shown electrically connecting light emitter 12 to a free end 15 of a protruding lead 16. Lead 28 is representative of any number of leads that may be used as necessary for the proper operation of light emitter 12. This arrangement allows for the proper operation of light emitter 12 and light detectors or photosensors 18 and 22 while electrically isolating light emitter 12 and light detectors or photosensors 18 and 22 from each other and the circuits and leads associated with each detector and emitter. This arrangement also allows light emitter 12 and light detectors 18 and 22 to be substantially coplanar, which may reduce manufacturing expenses.

Optical coupler 10 includes an outer mold or housing or exterior covering 36. Within outer mold 36 are two substances. The first is an inner mold material 30. A portion of inner mold material 30 forms a reflector 32. The second substance is a reflective material or coating 34 that may be applied over reflector 32.

Inner mold material 30 surrounds and encases light emitter 12, light detectors 18 and 22, and a portion of mount leads 14, 20 and 24, as well as portions of protruding leads 16 and the additional leads that may be associated with light emitter 12 and light detectors or photosensors 18 and 22 to cause each to operate properly, such as leads 17 and 28. The inner mold material may be a clear or translucent material with respect to the operative wavelengths involved for emitter 12 and detectors 18 and 22. For example, an epoxy may be used. One epoxy that is suitable is commercially available from Nitto Electric Industrial Company under the product designation NT 8510 Epoxy Transfer Molding Compound. Inner mold material 30 forms a suitable rigid, transparent encapsulation or encasement of the mentioned components and provides an electrical isolation which may exceed 10,000 volts DC between mount leads 14, 20 and 24 and other encased components.

Reflector 32 is molded as an upper surface of inner mold material 30. Reflector 32 is designed to function as a precision reflector with respect to emitter 12 and detectors 18 and 22. Reflector 32 may have various configurations such as the configuration shown in FIG. 2, which may be referred to as reflective dome 38 (it has a substantially semicircular cross-section) or a multifaceted vault as shown in FIG. 3, parabolic, oval, or other geometric shape. Reflector 32 efficiently returns light emitted by emitter 12 to light detectors or photosensors 18 and 22. Optical coupler 10 may include any number of light emitters 12 or photosensors 18 and 22, and the reflector 32 may be shaped to efficiently reflect light as desired to the number of emitters or detectors that might be included in any embodiment. Reflector 32 substantially optimizes the light transmission from reflector 32 to detectors 18 and 22 with consideration given to dye, mechanical, and spectral variables.

Disposed over inner mold material 30 or a portion of inner mold material 30 is a reflective, mirrored coating or intermediate mold material 34; for example, titanium dioxide ($TiO_2$) may be used or a aluminum-based reflective material may be used. Reflective coating 34 enhances the reflective nature of reflector 32.

Once the internal optical coupler components such as light emitter 12, light detectors 18 and 22, and mount leads 14, 20 and 24, lead 15, and portions of leads 16 are encapsulated or encased by inner mold material 30 and reflective, mirrored coating 34 applied, an overmold or outermold 36 may be molded over the components. Overmold 36 may be an opaque, non-conductive material that encapsulates the entire optical coupler 10 to form an opaque package. Overmold 36 is opaque to the operative wavelengths associated with emitter 12 and light detectors or photosensors 18 and 22 and helps to prevent interference by ambient electromagnetic wavelengths. Before providing overmold 36 onto optical coupler 10, a layer of the reflective, mirrored coating 34 may also be provided underneath (for the shown orientation of the figures) light emitter 12 and light detectors or photosensors 18 and 22 as well as other leads, e.g., 24, to further enhance the light transmitting efficiency of optical coupler 10. See FIGS. 2 and 3.

Figure 2:
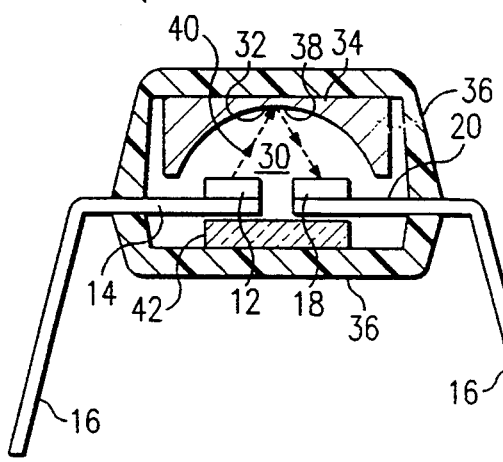
FIG. 2 is a schematic cross-sectional view of one embodiment of an optical coupler incorporating an aspect of the present invention.
Figure 3:
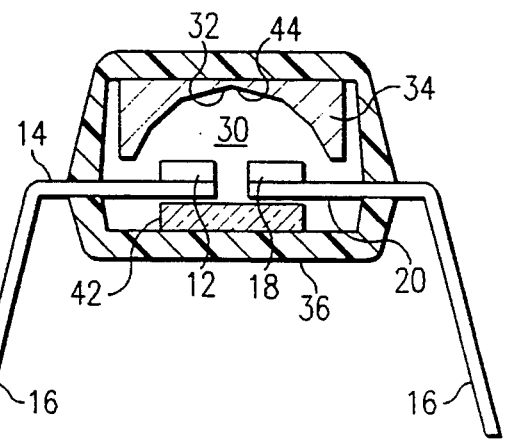
FIG. 3 is a schematic cross-sectional view of another embodiment of an optical coupler incorporating an aspect of the present invention.

Referring to FIG. 2, there is shown a schematic cross sectional view of an optical coupler 10. Light emitter 12 is attached to first mount lead 14 of protruding lead 16. Light detector 18 is coupled to second mount lead 20 of protruding lead 16. An inner mold material 30 surrounds and encases light emitter 12 and light detector 18. Inner mold material 30 is substantially transparent to the operative wavelengths of light emitter 12 and light detector 18.

Formed as a part of inner mold material 30 that is disposed proximate light emitter 12 and light detector 18 is precision reflector 32 in the form of precision molded dome 38. Dome 38 may be formed above emitter 12 and detector or photosensor 18 by referencing to the leadframe 46 and mold during the molding and mounting process as will be discussed in connection with FIG. 4. Dome 38 may be shaped to provide the optimum light reflection from emitter 12 to detector 18; the path of one light ray 40 is figuratively shown travelling from emitter 12 to dome 38 and then to detector 18. Precision molded dome 38, which is one possible precision reflector 32 that may be used, is coated with a reflective or mirror-like coating 34 that allows dome 38 to more effectively reflect light. A layer of reflective material 42, which may be of the same type of material that coats a surface of dome 38, i.e., coating 34, may be disposed on the side of light emitter 12 and light detector or photosensor 18 opposite dome 38. Optical coupler 10 has an external overmold 36 for completing the packaging and reducing or eliminating the effects of ambient light.

Precision molded reflector 32 enhances the efficiency of light transfer from light emitter 12 to light detector 18; precision molded reflector 32 efficiently focuses the emitted light from light emitter 12 onto detector 18.

Precision reflector 32 may also be a multi-faceted vault 44 as shown in FIG. 3. Multi-faceted vault 44 may contain a plurality of angled surfaces which are oriented to efficiently transfer light rays received from light emitter 12 to light detector 18.

Referring now to FIG. 4, there is shown a leadframe 46 that may be used in manufacturing optical coupler 10. Leadframe 46 has first parallel rail 48 and a second parallel rail 50. Rails 48 and 50 may include a plurality of holes 52 which facilitate handling of leadframe 46 during fabrication of optical couplers 10 by allowing such processes as tractor feeding of leadframe 46. Leadframe 46 may be used to form protruding leads 16 and mount leads 14, 20 and 24.

The free ends 15 of the leads (see also FIG. 1), may be connected by delicate wires 17, 28, to the proper points on emitter 12 and detectors 18 and 22. While still on leadframe 46, protruding leads 16 and mount leads 14, 20 and 24 are substantially coplanar.

After the various mold compounds are applied as discussed in connection with FIGS. 1-3, protruding leads 16 may be cut free from first rail 48 and second rail 50 and bent to the desired packaged shape; for example, it may be desirable to bend leads 16 approximately 90°. See FIGS. 2 and 3. While still on leadframe 46, inner mold material 30 is disposed over emitter 12 and detector 18 and 22 as well as the remaining components in central section 54. An aspect of forming inner mold material 30 over central section 54 is to provide or form the precision molded reflector 32.

After reflector 32 is formed, reflective coating 34 may be applied over reflector 32. Overmold 36 may be applied over coating 34 so as to encase central portion 54, and then the protruding leads 16 may be cut free from leadframe 46 and bent if desired. Reflector 32 allows for efficient transmission of light between emitter 12 and detector 18 while still allowing emitter 12 and detector 18 to be formed on a single leadframe 46 that is substantially planar; this may reduce fabrication expenses.

In manufacturing optical coupler 10, a manufacturer may provide first and second mount leads 14 and 20 as part of protruding leads 16 on leadframe 46. A light emitter 12 may then be coupled to first mount lead 14, and a light detector or photosensor 18 coupled to second mount lead 20. Light emitter 12 and light detector 18 may be matched in terms of operative wavelength. Light emitter 12 and light detector 18 may be placed on mount leads 14 and 20 without electrical connections between them in order to maintain the electrical isolation of emitter 12 and detector 18. The additional leads that may be necessary to cause emitter 12 and detector 18 to function properly such as leads 17 and 28 are also coupled to emitter 12 and detector 18. Light emitter 12 and light detector 18 may then be surrounded and encased by an inner mold 30, which is substantially transparent to the wavelengths of the light emitted by light emitter 12. This step entails placing a mold over the components and injecting material 30 into the mold. Material 30 will conform to the mold. A precision reflector 32 is formed as part of inner mold material 30 proximate light emitter 12 and light detector 18. Precision reflector 32 is formed as part of material 30 by providing a polished surface on a portion of the mold into which material 30 is injected. The mold through which material 30 is injected may then be removed. A reflective coating 34 may then be placed on the surface of reflector 32 to facilitate the reflection of light.

Inner mold material 30 and a portion of the first and second mount leads 14 and 20 are encased by an overmold 36. Light emitter 12 may be a light emitting diode. Light detector or photosensor 18 may be a photodiode. Inner mold material 30 may be an epoxy material. Precision reflector 32 may be a precision molded dome 38 or a precision molded multi-faceted vault 44, which is coated by a reflective coating 34. Overmold 36 may be an opaque, non-conductive material.

Although the present invention and its advantages have been described in detail, it should be understood that various changes, substitutions and alterations can be made therein without departing from the spirit and scope of the invention as defined by the appended claims.

What is claimed is:

1. A method of manufacturing an optical coupler comprising:
   providing a leadframe having at least a first and second mount lead;
   coupling a light emitter to the first mount lead;
   coupling a light detector to the second mount lead with the light detector electrically isolated from the light emitter;
   surrounding and encasing the light emitter and light detector with an inner mold material;
   molding the inner mold material in place to form a transparent encapsulation having a molded surface defining a precision reflector over the light emitter and light detector; applying a reflective coating over the precision molded surface; and
   encasing the molded inner mold material encapsulation, applied reflective material coating, and a portion of the first and second mount leads with an overmold.

2. The method of claim 1 wherein the step of coupling a light emitter to the first mount lead comprises coupling a light emitting diode to the first mount lead.

3. The method of claim 1 wherein the step of coupling a light detector to the second mount lead comprises coupling a photodiode to the second mount lead.

4. The method of claim 1 wherein the step of surrounding and encasing the light emitter and light detector with an inner mold comprises surrounding an encasing the light emitter and light detector with an epoxy material.

5. The method of claim 1, wherein the molding step comprises molding the inner mold material to form the encapsulation having the precision molded surface defining a precision reflective dome over of the light emitter and light detector; and wherein the applying step comprises coating the precision reflective dome with the reflective coating.

6. The method of claim 1, wherein the molding step comprises molding the inner mold material to form the encapsulation having the precision molded surface defining a precision molded multi-faceted vault as part of the inner mold with the vault disposed proximate the emitter and detector; and wherein the applying step comprises coating the molded multi-faceted vault with the reflective coating.

7. The method of claim 1 wherein the step of encasing the inner mold material and a portion of the first and second mount leads with an overmold comprises encasing the inner mold material and a portion of the first and second mount leads with an opaque, non-conductive material.

8. The method of claim 1, wherein the step of applying a reflective coating over the precision molded surface comprises applying a titanium dioxide coating.

9. The method of claim 1, wherein the step of applying a reflective coating over the precision molded surface comprises applying an aluminum-based reflective material.

10. The method of claim 1, wherein the molding step comprises molding the inner mold material to further form a second molded surface opposite the precision molded surface; and wherein the applying step comprises applying the reflective coating also over the second molded surface.

11. A method of manufacturing an optical coupler comprising:
    providing a leadframe having at least a first and second mount lead;
    coupling a light emitter to the first mount lead;
    coupling a light detector to the second mount lead with the light detector electrically isolated from the light emitter;

placing a mold over the light emitter and light detector;

inserting molding material into the mold to form a transparent encapsulation having a molded surface defining a reflector for reflecting emitted light from the light emitter to the light detector;

removing the mold;

applying an intermediate molding material to provide a reflective coating over the molded surface; and applying an overmold molding material over the transparent encapsulation and reflective coating to provide an opaque, non-conductive overmold encasement.

12. The method of claim 11, wherein the molded surface defines a precision molded dome.

13. The method of claim 11, wherein the molded surface defines a precision molded multi-faceted vault comprising a plurality of angled surfaces which are oriented to transfer light rays received from the light emitter to the light detector.

14. The method of claim 11, wherein the transparent encapsulation has a portion underneath the light emitter and light detector; and wherein the method further comprises the step of applying a layer of reflective coating to the underneath portion of the transparent encapsulation.

15. The method of claim 11, wherein the formed encapsulation is a rigid encapsulation that provides electrical isolation between the light emitter and light detector.

16. A method of manufacturing an optical coupler comprising:

providing a leadframe having rails, and first and second mount leads having ends mechanically connected to the rails and having free ends;

coupling a light emitter to the free end of the first mount lead;

coupling a light detector to the free end of the second mount lead with the light detector electrically isolated from the light emitter;

placing a mold over the light emitter and light detector;

injecting molding material into the mold to form a rigid, transparent encapsulation having an upper molded surface defining a precision reflector for reflecting emitted light from the light emitter to the light detector;

removing the mold;

applying a reflective, mirrored coating over the upper molded surface;

molding an opaque, non-conductive overmold encasement surrounding and encasing the transparent encasement, the coating and the mount lead free ends; and severing the mechanically connected ends of the mount leads from the rails.

17. The method of claim 16, further comprising bending the severed ends of the mount leads to form an optical coupler package shape.

18. The method of claim 16, wherein, in the placing step, the mold includes a polished surface; and wherein, in the injecting step, the precision reflector is formed by the polished surface.

* * * * *